United States Patent [19]

Nayebi et al.

[11] Patent Number: 5,691,663

[45] Date of Patent: Nov. 25, 1997

[54] SINGLE-ENDED SUPPLY PREAMPLIFIER WITH HIGH POWER SUPPLY REJECTION RATIO

[75] Inventors: Mehrdad Nayebi, Palo Alto; Mahmud Musbah, Santa Clara, both of Calif.; Norio Shoji, Yokohama, Japan

[73] Assignees: Sony Corporation, Tokyo, Japan; Sony Electronics, Inc., Park Ridge, N.J.

[21] Appl. No.: 621,653

[22] Filed: Mar. 25, 1996

[51] Int. Cl.[6] .................................................. G06G 7/12
[52] U.S. Cl. .......................... 327/560; 327/379; 327/563; 330/290
[58] Field of Search ........................ 330/290, 296, 330/310; 327/379, 560, 561, 562, 563; 360/46, 67, 68

[56] References Cited

U.S. PATENT DOCUMENTS 5,270,882  12/1993  Jove et al. ................... 360/67

Primary Examiner—Timothy P. Callahan
Assistant Examiner—Jeffrey Zweizig
Attorney, Agent, or Firm—Haverstock & Associates

[57] ABSTRACT

A single-ended input amplifier circuit for use within a magnetic media storage system includes circuits for concurrently biasing and amplifying signals generated by a magnetoresistive element. The amplifier receives power from a single-ended power supply. A first resistor is included for setting the gain of the amplifier and providing an output signal corresponding to the signals generated by the magnetoresistive element. A first feedback circuit generates a first biasing current provided to the magnetoresistive element. The first feedback circuit includes a first transconductance amplifier which amplifies the difference between the output signal and a reference voltage. A second feedback circuit generates a second biasing current provided to the magnetoresistive element. The second feedback circuit includes a second transconductance amplifier which amplifies the difference between the reference voltage and a voltage signal taken from a node between two resistors. A transistor is coupled between the receiving circuit and the first resistor for controlling the generation of the output signal by the first resistor. The transistor is controlled by the output of the second transconductance amplifier and a first capacitor. The first resistor, the transistor and the second feedback circuit are all referenced to the single-ended supply voltage for providing an increased power supply rejection ratio. The second biasing current is provided through two resistors thereby increasing the output impedance of the amplifier circuit.

11 Claims, 3 Drawing Sheets

SINGLE-ENDED SUPPLY PREAMPLIFIER WITH HIGH POWER SUPPLY REJECTION RATIO

FIELD OF THE INVENTION

The present invention relates to the field of amplifiers within magnetic storage systems using magnetoresistive sensors. In particular, the present invention relates to the field of low noise amplifiers for amplifying a signal received from a magnetoresistive sensor within a magnetic storage system.

BACKGROUND OF THE INVENTION

To read recorded data from a magnetic media storage system, a read/write head including a magnetoresistive sensor is passed over a magnetic medium and transduces the magnetic transitions into pulses of an analog signal that alternates in polarity. This analog signal is then amplified by a pre-amplifier stage within the magnetic media storage system and provided to and decoded by read channel circuitry, included in a circuit that is generally mounted on a motherboard within the host system, to reproduce the digital data.

The pre-amplifier circuit is generally included within a read/write chip coupled inside the storage media system. Typically, the read/write chip is encapsulated in a surface mount package. The design of the read/write chip is typically bound by the specifications that it is to dissipate the minimum amount of power possible and add the minimum amount of spurious electrical noise possible to the signal. The small signals extracted from the magnetic media by the read/write head can also be accompanied by spurious signals induced through capacitive or inductive coupling and wide band noise.

The quality of the signal provided to the read channel circuitry is important to the correspondence of the read output signal to the data read from the magnetic medium. It is important to preserve the quality of the signal output from the storage media system through the read channel in order to get a true digital representation of the data read from the storage medium. Any noise included within the signal output from the storage media system may effect the quality of the digital read output signal output from the read channel and result in errors in the transmission of the information read from the magnetic media.

A Low-Voltage, Low-Power Amplifier For Magnetoresistive Sensor is taught in U.S. Pat. No. 5,270,882 issued on Dec. 14, 1993 to Jove et al. This amplifier has a single-ended input with no common mode rejection for concurrently biasing and amplifying signals generated by the magnetoresistive elements in a magnetic storage system. A schematic diagram of the amplifier circuit taught by Jove et al. is illustrated in FIG. 1. The amplifier circuit comprises a magnetoresistive (MR) element MR which senses binary data from a magnetic medium. The resistance of the MR element changes as the magnetic induction from the magnetic medium changes. A first terminal of the MR element is coupled to ground. A second terminal of the MR element is coupled to the emitter of an npn transistor Q1. The collector of the transistor Q1 is coupled to the emitter of an npn transistor Q2 and to the collector of a pnp transistor Q3. A first terminal of a voltage supply V1 is coupled to ground. A second terminal of the voltage supply V1 is coupled to the base of the transistor Q2.

The collector of the transistor Q2 is coupled to the first terminal of a resistor R1 and to a negative input of the transconductance amplifier g0. The second terminal of the resistor R1 is coupled to a supply voltage Vcc. A positive input of the amplifier g0 is coupled to a positive input of the transconductance amplifier g1 and to a first terminal of the reference voltage source Vref. A second terminal of the reference voltage source Vref is coupled to the supply voltage Vcc. The output of the amplifier g0 is coupled to the base of the transistor Q1 and to the first terminal of a capacitor C1. The second terminal of the capacitor C1 is coupled to ground. A negative input of the amplifier g1 is coupled to the emitter of the transistor Q3 and to the first terminal of the resistor R2. The output of the amplifier g1 is coupled to the base of the transistor Q3 and to a first terminal of a capacitor C2. A second terminal of the capacitor C2 and a second terminal of the resistor R2 are coupled to the supply voltage Vcc.

The gain of the amplifier circuit of FIG. 1 is set by the resistor R1. The emitter of the transistor Q1 supplies bias current to the MR element. The output voltage signal Vout of the amplifier circuit is provided as the voltage difference between the first terminal of the resistor R1 and the first terminal of the reference voltage Vref. The output voltage signal Vout corresponds to an amplified version of the input signal current developed by the MR element while being concurrently biased with the biasing current from the transistor Q1.

The reference voltage Vref sets a predetermined current through the resistor R1 by means of a feedback circuit. This feedback circuit includes a forward gain path and a reverse gain path. The reverse gain path includes the transconductance amplifier g0. The forward gain path includes the transistor Q1, the resistor R1 and the MR element. The transconductance amplifier g0 amplifies the output voltage signal Vout represented by the difference between the reference voltage Vref and the voltage level at the first terminal of the resistor R1. The output signal generated by the transconductance amplifier g0 is used to control the level of charge built up across the capacitor C1. The level of charge across the capacitor C1 controls the operation of the transistor Q1 through which current is provided to the MR element.

A second feedback circuit is used to supply additional biasing current through the transistor Q1 to the MR element. This allows the amplifier circuit to provide a larger biasing current to the MR element. In addition the forward gain of the circuit is also increased. The transconductance amplifier g1 amplifies the difference between the reference voltage Vref and the voltage level at the first terminal of the resistor R2 to generate a control current through the transistor Q3. This output of the transconductance amplifier g1 is used to control the level of charge built up across the capacitor C2, which controls the operation of the transistor Q3. The transistor Q3 converts the control voltage across the capacitor C2 into a control current provided to the emitter of the transistor Q2. This control current is provided to the MR element through the transistor Q1. The configuration of the transistor Q2 prevents this control current from flowing to the resistor R1. Because the impedance of the transistor Q3 as seen from the emitter of the transistor Q2 is much higher than the impedance at the emitter of the transistor Q2, nearly all of the ac signal current originating from the MR element is directed toward the resistor R1, allowing all of the signal current of the MR element to flow through the resistor R1.

In the amplifier circuit of FIG. 1, the base of the transistor Q2 is referenced to ground through the voltage source V1. However, the resistor R1 coupled to the collector of the transistor Q2 and the transistor Q3 coupled to the emitter of the transistor Q2, which both provide current to the transistor Q2, are referenced to the supply voltage Vcc. As the level of the supply voltage Vcc fluctuates, the voltage level at the first terminal of the resistor R1 and the operation of the transistor Q3 will be effected, changing the levels of current supplied to the transistor Q2. However, because the base of the transistor Q2 is referenced to ground while the resistor R1 and the transistor Q3 are referenced to the supply voltage Vcc, this arrangement will cause distortion and result in poor power supply rejection by the amplifier circuit.

The output impedance of the amplifier circuit of FIG. 1, looking from node A, at the collector of the transistor Q2, towards ground is demonstrated by the following equation:

$$r_{out} = r_{o2}(1 + gm_{Q2}r_{o1})$$

Where $r_{o1}$ is the output impedance of the transistor Q1 taken in parallel with the transistor Q3. At the node B, looking from the emitter of the transistor Q2 towards the collector of the transistor Q3, the DC current is generated by the transistor Q3 and the resistor R2. The transistor Q2 is therefore not in the DC loop.

What is needed is a single-ended amplifier circuit which has a greater power supply rejection ratio than the amplifier taught by Jove et al. What is further needed is an amplifier circuit which provides a greater output impedance.

SUMMARY OF THE INVENTION

A single-ended input amplifier circuit for use within a magnetic media storage system includes circuits for concurrently biasing and amplifying signals generated by a magnetoresistive element. The amplifier receives power from a single-ended power supply. A first resistor is included for setting the gain of the amplifier and providing an output signal corresponding to the signals generated by the magnetoresistive element. A first feedback circuit generates a first biasing current provided to the magnetoresistive element. The first feedback circuit includes a first transconductance amplifier which amplifies the difference between the output signal and a reference voltage. A second feedback circuit generates a second biasing current provided to the magnetoresistive element. The second feedback circuit includes a second transconductance amplifier which amplifies the difference between the reference voltage and a voltage signal taken from a node between two resistors. A transistor is coupled between the receiving circuit and the first resistor for controlling the generation of the output signal by the first resistor. The transistor is controlled by the output of the second transconductance amplifier and a first capacitor. The first resistor, the transistor and the second feedback circuit are all referenced to the single-ended supply voltage for providing an increased power supply rejection ratio. The second biasing current is provided through two resistors thereby increasing the output impedance of the amplifier circuit.

DETAILED DESCRIPTION OF THE PREFERRED EMBODIMENT

Figure 2:
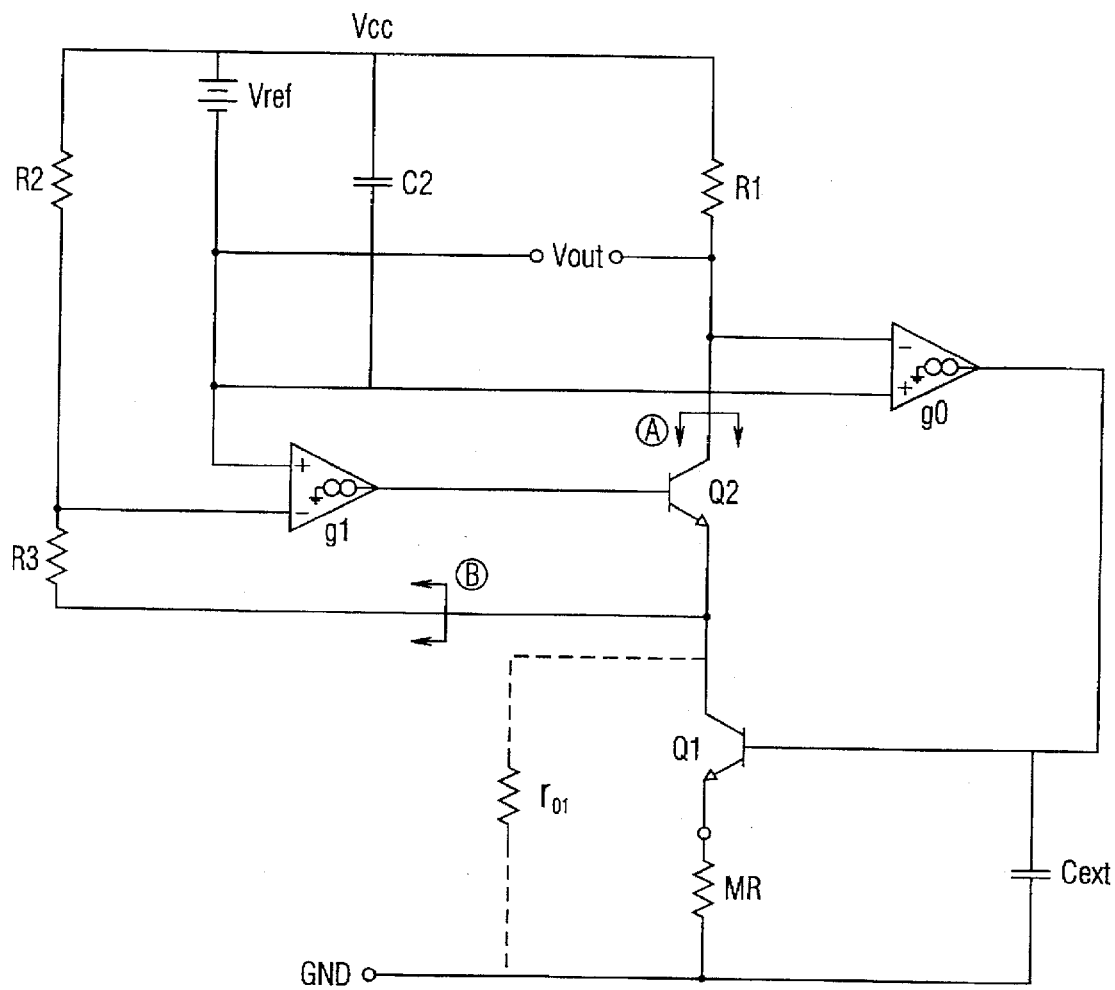
FIG. 2 illustrates a schematic diagram of a single-ended amplifier circuit according to the present invention.

A schematic diagram of the preferred embodiment of the single-ended amplifier of the present invention is illustrated in FIG. 2. A first terminal of the MR element is coupled to ground. A second terminal of the MR element is coupled to the emitter of an npn transistor Q1. The collector of the transistor Q1 is coupled to the emitter of an npn transistor Q2 and to the first terminal of a resistor R3. The collector of the transistor Q2 is coupled to the first terminal of a resistor R1 and to a negative input of a transconductance amplifier g0. The second terminal of the resistor R1 is coupled to the supply voltage Vcc. A positive input of the amplifier g0 is coupled to a positive input of the transconductance amplifier g1 and to a first terminal of the reference voltage source Vref. A second terminal of the reference voltage source Vref is coupled to the supply voltage Vcc. The output of the amplifier g0 is coupled to the base of the transistor Q1 and to the first terminal of a capacitor Cext. The second terminal of the capacitor Cext is coupled to ground. A negative input of the amplifier g1 is coupled to the second terminal of the resistor R3 and to the first terminal of a resistor R2. A second terminal of the resistor R2 is coupled to the supply voltage Vcc. The output of the transconductance amplifier g1 is coupled to a first terminal of a capacitor C2 and to the base of the transistor Q2. The second terminal of the capacitor C2 is coupled to the supply voltage Vcc.

Figure 1:
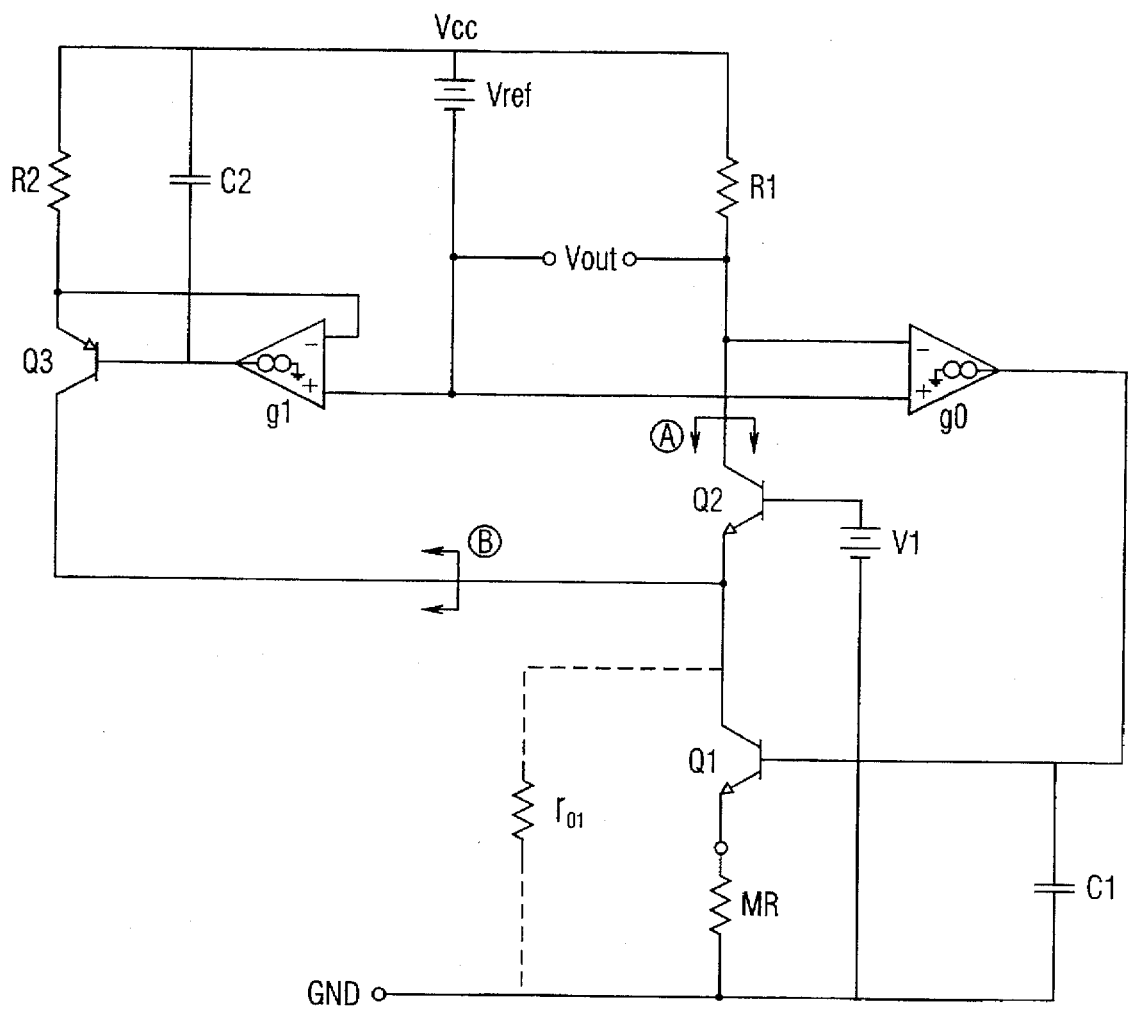
FIG. 1 illustrates a schematic diagram of a single-ended amplifier circuit for a magnetoresistive sensor of the prior art.

In the amplifier of the present invention, the transistor Q3 and the voltage source V1, included within the amplifier circuit of FIG. 1, are eliminated. The gain of the amplifier circuit is set by the resistor R1. Bias current is supplied to the MR element through the emitter of the transistor Q1. The output voltage signal Vout of the amplifier circuit is provided as the voltage difference between the first terminal of the resistor R1 and the first terminal of the reference voltage Vref. The output voltage signal Vout corresponds to an amplified version of the input signal current developed by the MR element while being concurrently biased with the biasing current from the transistor Q1.

The reference voltage Vref sets a predetermined current through the resistor R1 by means of a feedback circuit, again including a forward gain path and a reverse gain path. The reverse gain path includes the transconductance amplifier g0. The transconductance amplifier g0 amplifies the output voltage signal Vout represented by the difference between the reference voltage Vref and the voltage level at the first terminal of the resistor R1. The output signal generated by the transconductance amplifier g0 is used to control the level of charge built up across the capacitor Cext. The level of charge across the capacitor Cext controls the operation of the transistor Q1 and the amount of current provided to the MR element. The forward gain path includes the resistor R1, the transistor Q1 and the MR element.

A second feedback circuit is used to supply additional biasing current through the transistor Q1 to the MR element. The transconductance amplifier g1 amplifies the difference between the reference voltage Vref and the voltage level at the first terminal of the resistor R2 to control the operation of the transistor Q2. The output of the transconductance amplifier g1 is used to control the level of charge built up across the capacitor C2, which thereby controls the operation of the transistor Q2.

The DC current of the amplifier circuit of the present invention is provided through the resistors R2 and R3. The transistor Q2 is also in the DC loop. The base of the transistor Q2 is referenced to the voltage supply Vcc in the amplifier circuit of the present invention, through the transconductance amplifier g1 and the capacitor C2. The resistor R1, coupled to the collector of the transistor Q2, is also coupled to the supply voltage Vcc. The resistor R3, coupled to the emitter of the transistor Q2, is also coupled to the supply voltage Vcc through the resistor R2. Therefore, as the level of the supply voltage Vcc fluctuates, the level of the current provided by the resistor R1, the level of current flowing through the resistors R2 and R3 and the operation of the transistor Q2 will all fluctuate proportionately, cancelling out the deviation and providing a constant response at the output voltage Vout. Accordingly, less noise will be introduced to the amplifier circuit due to inherent changes in the level of the supply voltage Vcc, thereby providing for a greater power supply rejection ratio.

The output impedance of the amplifier circuit of the present invention is increased due to the control of the transistor Q2 by the transconductance amplifier g1. The output impedance of the amplifier circuit of the present invention looking from node A to ground is demonstrated by the following equation:

$$r_{out} = r_{o2}(1 + A_{g1} gm_{Q2} r_{o1})$$

The output impedance $r_{out}$ is therefore increased over the amplifier circuit of FIG. 1, due to the dc gain $A_{g1}$ of the transconductance amplifier g1.

Figure 3:
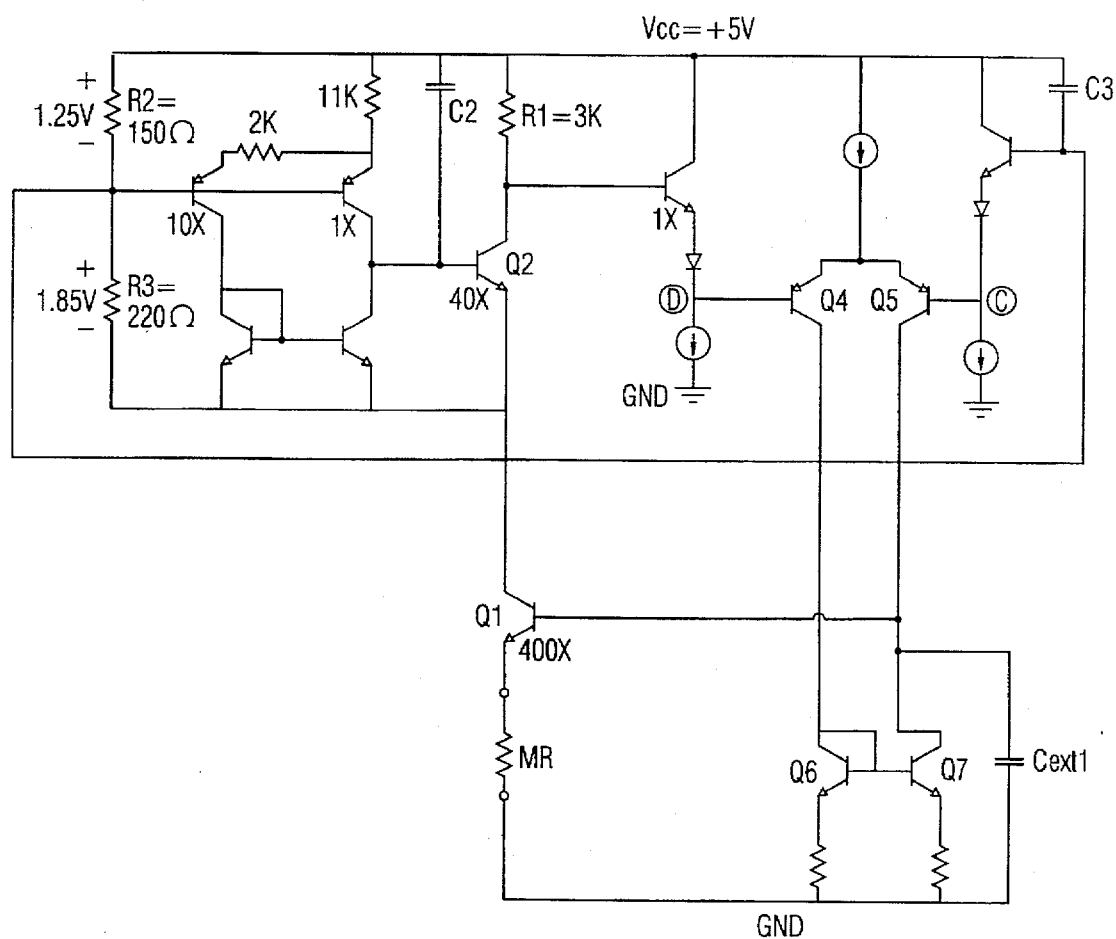
FIG. 3 illustrates a detailed schematic diagram of the preferred embodiment of the single-ended amplifier circuit of the present invention.
Figure 2:
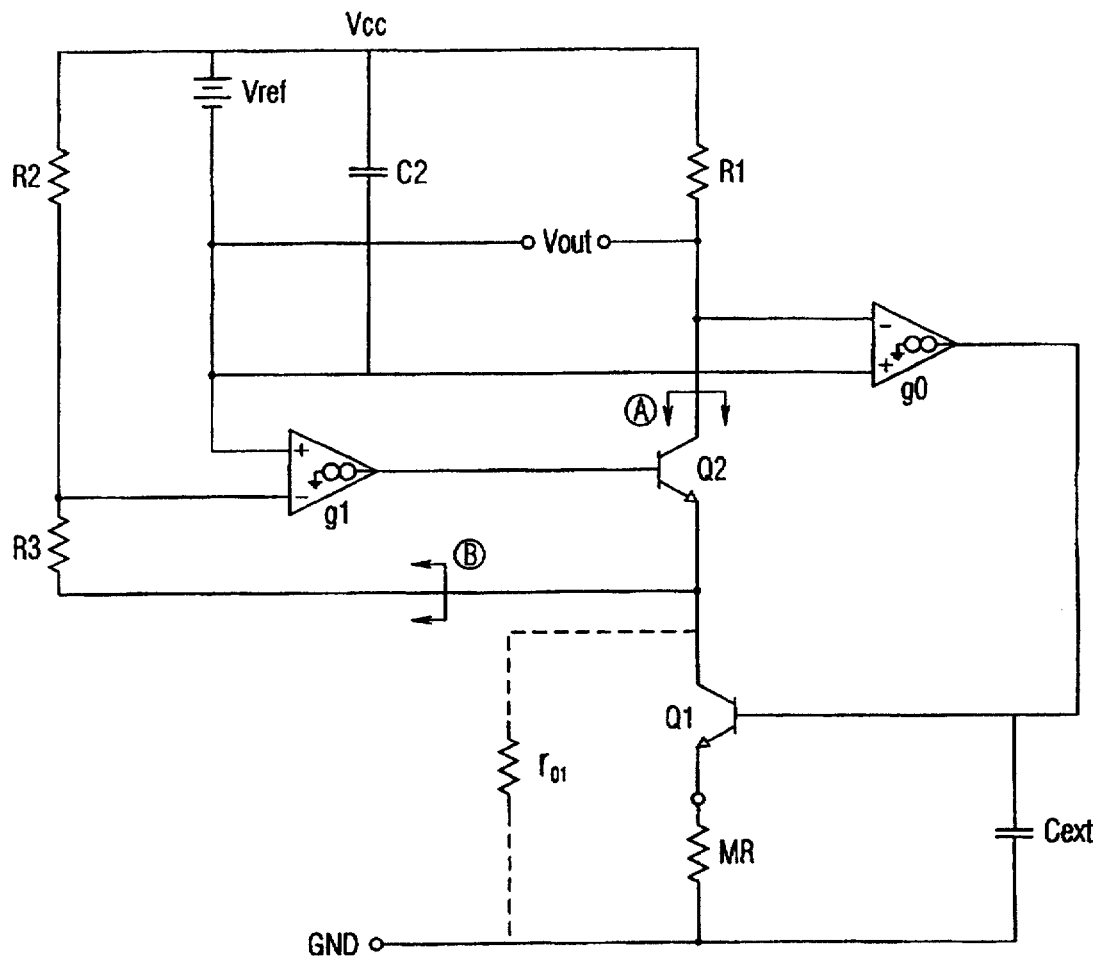

A detailed schematic diagram of the preferred embodiment of the single-ended amplifier circuit of the present invention is illustrated in FIG. 3.

The single-ended amplifier circuit of the present invention is designed to be included within a magnetic media storage system, wherein data is read from magnetic media using an MR element. The amplifier circuit of the present invention amplifies the signal read by the MR element and provides it as an output signal Vout. The amplifier circuit of the present invention is configured for providing the output signal Vout to read channel circuitry to reproduce the data read from the magnetic media in a digital format.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL. It will also be apparent to those skilled in the art that different logic circuit configurations could be substituted for the logic circuit described above to perform the functions of the preferred embodiment.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chose for illustration without departing from the spirit and scope of the invention.

We claim:

1. An amplifier circuit for simultaneously biasing and amplifying signals generated by a magnetoresistive element corresponding to data read from a magnetic medium, the amplifier circuit configured for receiving power from a single-ended supply voltage source and comprising:
   a. a receiving circuit configured for receiving the signals generated by the magnetoresistive element;
   b. a first circuit element for setting a gain of the amplifier circuit and providing an output signal corresponding to the signals generated by the magnetoresistive element;
   c. a reference voltage coupled to the single-ended supply voltage;
   d. a first biasing circuit for providing a first biasing current to the magnetoresistive element, the first biasing circuit controlled by a first voltage difference between the output signal and the reference voltage;
   e. a second biasing circuit for providing a second biasing current to the magnetoresistive element, the second biasing circuit controlled by a second voltage difference between a first voltage level and the reference voltage; and
   f. a first transistor coupled between the receiving circuit and the first circuit element for controlling generation of the output signal by the first circuit element, wherein the first circuit element, the transistor and the second biasing circuit are all referenced to the single-ended supply voltage for providing an increased power supply rejection ratio.

2. The amplifier circuit as claimed in claim 1 wherein the first circuit element is a resistor.

3. The amplifier circuit as claimed in claim 2 wherein the first biasing circuit includes a first transconductance amplifier and a first capacitor.

4. The amplifier circuit as claimed in claim 3 wherein the second biasing circuit includes a second transconductance amplifier and a second capacitor and further wherein the second transconductance amplifier builds a second charge on the second capacitor, the second charge for controlling operation of the first transistor.

5. The amplifier circuit as claimed in claim 4 further comprising a second transistor coupled between the first transistor and the magnetoresistive element wherein the first and second biasing currents are provided to the magnetoresistive element through the second transistor.

6. A magnetic media storage system comprising:
   a. a magnetic medium;
   b. a magnetoresistive element for generating signals corresponding to information stored on the magnetic medium;
   c. a single-ended supply voltage source; and
   d. an amplifier circuit coupled to the single-ended supply voltage source and to the magnetoresistive element for simultaneously biasing and amplifying a signal generated by the magnetoresistive element, including:
      i. a first circuit element for setting a gain of the amplifier circuit and providing an output signal corresponding to the signal generated by the magnetoresistive element;
      ii. a reference voltage coupled to the single-ended supply voltage;
      iii. a first biasing circuit for providing a first biasing current to the magnetoresistive element, the first biasing circuit controlled by a first voltage difference between the output signal and the reference voltage;
      iv. a second biasing circuit for providing a second biasing current to the magnetoresistive element, the second biasing circuit controlled by a second voltage difference between a first voltage level and the reference voltage; and
      v. a first transistor coupled between the magnetoresistive element and the first circuit element for controlling generation of the output signal by the first circuit element, wherein the first circuit element, the transistor and the second biasing circuit are all referenced to the single-ended supply voltage for providing an increased power supply rejection ratio.

7. The magnetic media storage system as claimed in claim 6 wherein the first circuit element is a resistor.

8. The magnetic media storage system as claimed in claim 7 wherein the first biasing circuit includes a first transconductance amplifier and a first capacitor.

9. The magnetic media storage system as claimed in claim 8 wherein the second biasing circuit includes a second transconductance amplifier and a second capacitor and further wherein the second transconductance amplifier builds a second charge on the second capacitor, the second charge for controlling operation of the first transistor.

10. The magnetic media storage system as claimed in claim 9 further comprising a second transistor coupled between the first and the magnetoresistive element wherein the first and second biasing currents are provided to the magnetoresistive element through the second transistor.

11. An amplifier circuit for simultaneously biasing and amplifying signals generated by a magnetoresistive element corresponding to data read from a magnetic medium, the amplifier circuit configured for receiving power from a single-ended supply voltage source and comprising:

a first resistor having a first terminal coupled to the single-ended supply voltage source;

a first transistor having an emitter coupled to the magnetoresistive element;

a second transistor having an emitter coupled to a collector of the first transistor and a collector coupled to a second terminal of the first resistor;

a first capacitor having a first terminal coupled to a base of the first transistor and a second terminal coupled to ground;

a second capacitor having a first terminal coupled to the single-ended supply voltage source and a second terminal coupled to a base of the second transistor;

a reference voltage source coupled to the single-ended supply voltage source;

a first transconductance amplifier having a first input coupled to the second terminal of the first resistor and to the collector of the second transistor, a second input coupled to the reference voltage and an output coupled to the base of the first transistor and to the first terminal of the first capacitor;

a second resistor having a first terminal coupled to the single-ended supply voltage source;

a third resistor having a first terminal coupled to a second terminal of the second resistor and a second terminal coupled to the emitter of the second transistor and to the collector of the first transistor; and a second transconductance amplifier having a first input coupled to the second input of the first transconductance amplifier and to the reference voltage, a second input coupled to the second terminal of the second resistor and the first terminal of the third resistor and an output coupled to the second terminal of the second capacitor and to the base of the second transistor.

\* \* \* \* \*

UNITED STATES PATENT AND TRADEMARK OFFICE
CERTIFICATE OF CORRECTION

PATENT NO. : 5,691,663
DATED : November 25, 1997
INVENTOR(S) : Mehrdad Nayebi et al.

It is certified that error appears in the above-identified patent and that said Letters Patent is hereby corrected as shown below:

IN THE DRAWINGS

The following is a true and correct copy of Figure 2:

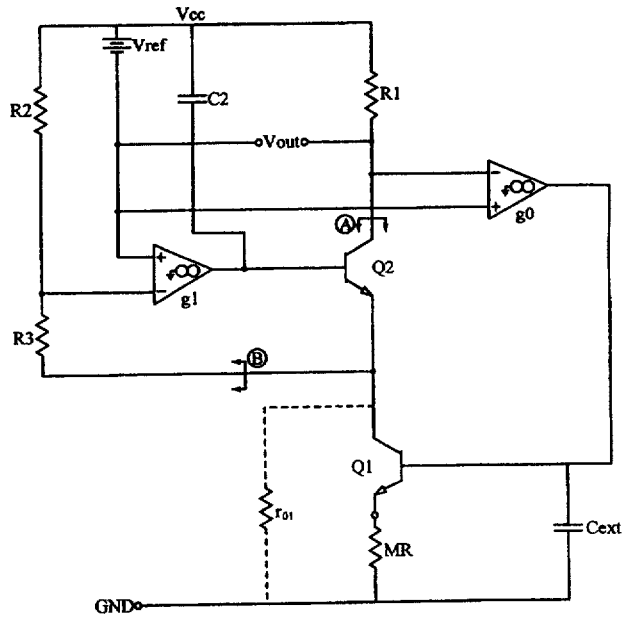

*Fig. 2*

Signed and Sealed this

Twenty first Day of August, 2001

*Attest:*

*Attesting Officer*

NICHOLAS P. GODICI
*Acting Director of the United States Patent and Trademark Office*